United States Patent

Banker et al.

Patent Number: 5,245,225
Date of Patent: Sep. 14, 1993

[54] HIGH PERFORMANCE BIFET COMPLEMENTARY EMITTER FOLLOWER LOGIC CIRCUIT

[75] Inventors: Dennis C. Banker, Newburgh; Jack A. Dorler, Holmes; Francesco M. Masci, Wappingers Falls, all of N.Y.

[73] Assignee: International Business Machines Corporation, Armonk, N.Y.

[21] Appl. No.: 874,273

[22] Filed: Apr. 24, 1992

[51] Int. Cl.$^5$ ............................................. H03K 19/02
[52] U.S. Cl. ...................................... 307/446; 307/570
[58] Field of Search ........................ 307/446, 570, 495

[56] References Cited

U.S. PATENT DOCUMENTS

| | | | |
|---|---|---|---|
| 4,616,146 | 10/1986 | Lee et al. | 307/446 |
| 4,701,642 | 10/1987 | Pricer | 307/446 |
| 4,746,817 | 5/1988 | Banker et al. | 307/446 |
| 4,977,337 | 12/1990 | Ohbayashi et al. | 307/446 |
| 4,977,338 | 12/1990 | Miyaoka et al. | 307/446 |
| 5,117,134 | 5/1992 | Aso | 307/446 |
| 5,166,552 | 12/1992 | Aipperspach | 307/446 |

FOREIGN PATENT DOCUMENTS 0171022  7/1990  Japan .................................. 307/446

OTHER PUBLICATIONS

BICMOS Selector, IBM Technical Disclosure Bulletin, vol. 34, No. 2, Jul. 1991.

*Primary Examiner*—Edward P. Westin
*Assistant Examiner*—Andrew Sanders
*Attorney, Agent, or Firm*—Whitham & Marhoefer

[57] ABSTRACT

A high performance bipolar, field effect transistor (Bi-FET) logic circuit has minimal power supply requirements, allowing the circuit to be manufactured in higher density devices than current switched emitter follower (CSEF). BiFET logic circuit has a plurality of input lines and first and second output lines. A plurality of FET devices are connected in parallel each having a gate connected to a corresponding one of the input lines. Two bipolar transistors are connected as a differential pair, the parallel connection of said FET devices providing an input to the base of the first bipolar transistor while the base of the second bipolar transistor is supplied with a reference voltage. Output bipolar transistors connected as emitter followers drive the first and second output lines respectively. One of these output bipolar transistors is driven by the first bipolar transistor of the differential pair, while the other of the output bipolar transistors is driven by the second bipolar transistor of the differential pair. By dotting the collectors of the differential pair, as is commonly done in CSEF circuits, additional logic functions are obtained; however, the number of additional logic functions obtained is greater than that obtainable in CSEF circuits. Thus, the BiFET has the additional advantage of providing additional logic function and flexibility as compared with CSEF circuits.

6 Claims, 6 Drawing Sheets

HIGH PERFORMANCE BIFET COMPLEMENTARY EMITTER FOLLOWER LOGIC CIRCUIT

BACKGROUND OF THE INVENTION

1. Field of the Invention

The present invention generally relates to logic circuits implemented in integrated circuit (IC) technology and, more particularly, to an improved bipolar, field effect transistor (BiFET) logic circuit which provides greater logic flexibility with comparable performance of current switched emitter follower (CSEF) circuits but which minimizes power supply requirements allowing higher density integration.

2. Description of the Prior Art

The current switch emitter follower (CSEF) circuit has been a preferred logic circuit where high performance and logic flexibility is a requirement. The CSEF circuit provides a good speed and power trade-off with respect to NOR/OR logic and excellent line driving capabilities; however, the power supply requirements of the circuit are a persistent area of concern. With ever increasing demands for higher circuit density, the amount of area required for the distribution of three power supply voltages ($V_{CC}$, $V_{EE}$ and $V_T$) has an adverse impact on the circuit density that can be achieved. This short coming makes it desirable to find an alternative to the CSEF technology.

SUMMARY OF THE INVENTION

It is therefore an object of the present invention to provide a high performance logic circuit which provides greater logic flexibility than CSEF circuits and are inexpensive to manufacture.

It is another object of the invention to provide a high performance logic circuit having minimal power supply requirements, allowing the circuit to be manufactured in higher density devices than CSEF circuits.

It is a further object of the invention to provide a new high performance logic circuit which offers greater performance potential than CSEF circuits.

According to the invention, there is provided a bipolar, field effect transistor (BiFET) logic circuit having a plurality of input lines and first and second output lines. A plurality of FET devices are connected in parallel each having a gate connected to a corresponding one of the input lines. Two bipolar transistors are connected as a differential pair, the parallel connection of said FET devices providing an input to the base of the first bipolar transistor while the base of the second bipolar transistor is supplied with a reference voltage. Output bipolar transistors connected as emitter followers drive the first and second output lines respectively. One of these output bipolar transistors is driven by the first bipolar transistor of the differential pair, while the other of the output bipolar transistors is driven by the second bipolar transistor of the differential pair. By dotting the collectors of the differential pair, as is commonly done in CSEF circuits, additional logic functions are obtained; however, the number of additional logic functions obtained is greater than that obtainable in CSEF circuits. Thus, the invention has the additional advantage of providing additional logic function and flexibility as compared with CSEF circuits.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
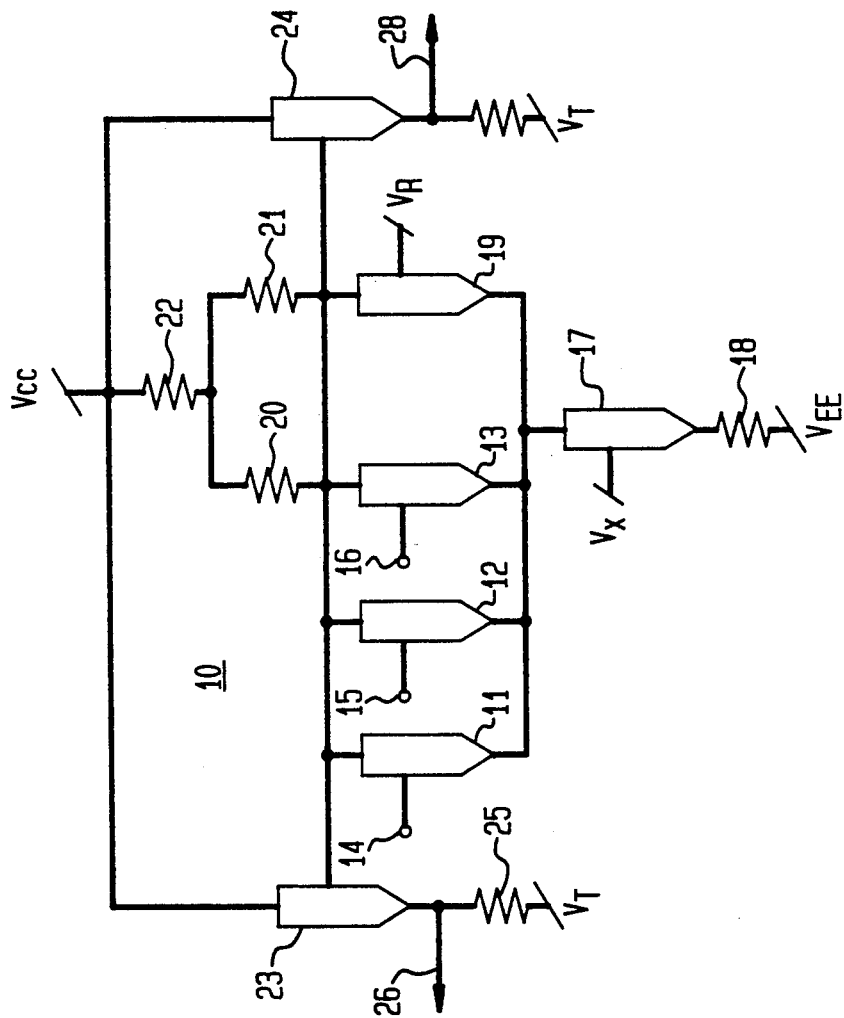
FIG. 1 is a schematic diagram of a known bipolar current switch emitter follower (CSEF) circuit.

Referring now to the drawings, and more particularly to FIG. 1, there is shown an example of a known current switch emitter follower (CSEF) circuit 10 which has been a preferred circuit choice for high speed applications. The circuit is capable of performing various logical functions, including AND, OR and INVERT functions, and therefore may be used construct a variety of logical circuits. This is a bipolar transistor circuit and comprises first, second and third parallel NPN input transistors 11, 12 and 13, each having a base connected to a respective one of logic input terminals 14, 15 and 16. The emitters of the input transistors are connected in common to the collector of NPN transistor 17, the emitter of which is connected to a negative power supply voltage, $V_{EE}$, through resistor 18 and the base of which is connected to a source of bias voltage, $V_X$. Transistor 17 along with resistor 18 and the bias voltage $V_X$ function as a constant current source. NPN transistor 19 also has its emitter connected to the collector of transistor 17. The base of transistor 19 is connected to a source of reference voltage, $V_R$. The reference voltage $V_R$ biases transistor 19 to be normally conducting when none of the transistors 11, 12 or 13 are conducting. The collectors of transistors 11, 12 and 13 are connected in common to a resistor 20, while the collector of transistor 19 is connected to a resistor 21. The two resistors 20 and 21 are, in turn, connected via a resistor 22 to a source of positive power supply voltage $V_{CC}$. Outputs for the circuit are derived from two NPN transistors 23 and 24 connected as emitter followers. Transistor 23 has its base connected to the common connection of the collectors of the input transistors 11, 12 and 13, while transistor 24 has its base connected to the collector of transistor 19. The collectors of transistors 23 and 24 are both connected to the positive power supply voltage $V_{CC}$. The emitter of transistor 23 is connected by resistor 25 to a source of power supply voltage $V_T$ and to an output terminal 26. The emitter of transistor 24 is connected by resistor 27 to the source of power supply voltage $V_T$ and to an output terminal 28.

Figure 2:
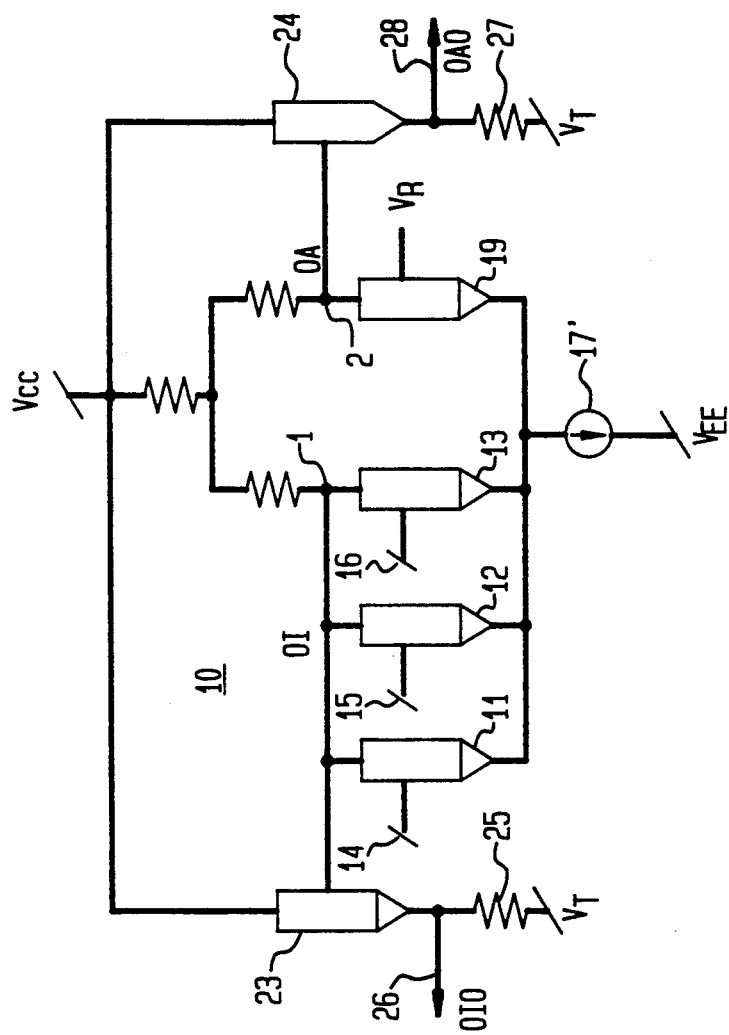
FIG. 2 is a simplified schematic diagram which illustrates the operation of the circuit shown in FIG. 1.

The operation of the circuit will now be described with reference to FIG. 2 which shows the transistor 17 represented as a constant current source 17'. A positive input voltage to any one of the input terminals 14, 15 or 16 will cause the corresponding input transistor 11, 12 or 13 to conduct, thereby lowering the voltage at the base of transistor 23, cutting that transistor off. The output terminal 26 will therefore assume a voltage corresponding to a logical "0". Assigning the inputs at terminals 14, 15 and 16 with the logical designations of A, B and C, respectively, then the output at terminal 26 is $\overline{A+B+C}$ or $\overline{A}\cdot\overline{B}\cdot\overline{C}$. On the other hand, the conduction of any one of the input transistors 11, 12 or 13 raises the emitter voltage of transistor 19 causing it to turn off, thus raising the voltage to the base of output transistor 24 causing it to conduct. The conduction of transistor 24 raises the voltage of output terminal 28 corresponding to a logical "1". Then the output at terminal 28 is A+B+C. Thus, the logical circuit performs the function of an NOR gate at output terminal 26 and an OR gate at output terminal 28. By dotting the collectors of transistors 13 and 19 as nodes 1 and 2, respectively, as is commonly done in CESF circuits, invert and AND functions can also be obtained. This is indicated by the rotation "OIO" (OR, invert, OR) at terminal 26 and "OAO" (OR, AND, OR at terminal 28.

This circuit has superior performance characteristics, exhibiting fast switching times, and allows great flexibility in logic design. However, the CSEF circuit requires a power supply providing multiple voltage levels. The amount of area required for distribution of the voltage levels $V_{CC}$, $V_{EE}$ and $V_T$ directly impacts on circuit density.

Figure 3:
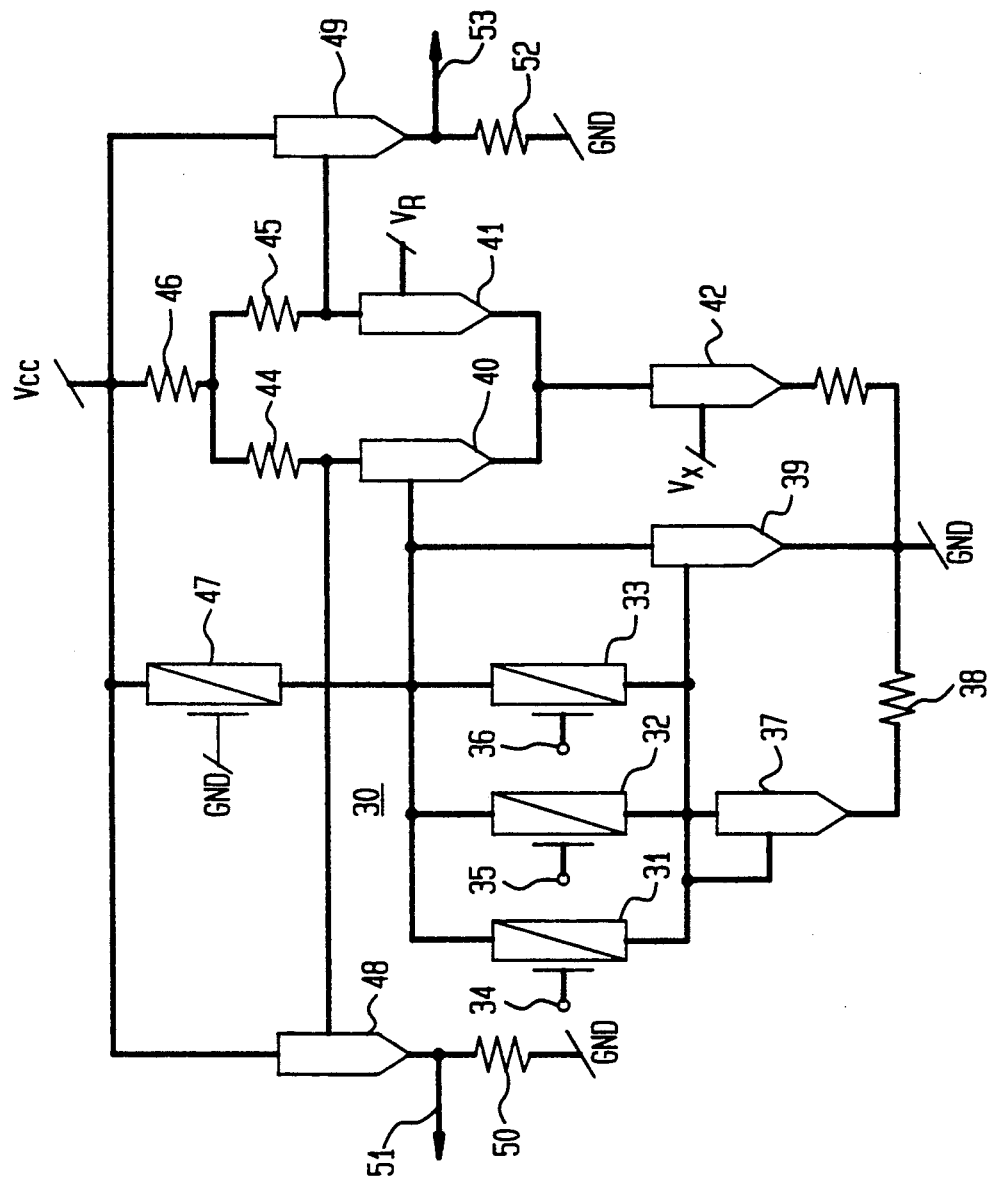
FIG. 3 is a schematic diagram of the BiFET complementary emitter follower circuit according to the invention.

FIG. 3 shows a bipolar, field effect transistor (BiFET) circuit 30 according to the invention. This circuit comprises first, second and third parallel P-type field effect transistors (PFETs) transistors 31, 32 and 33, each having a gate connected to a respective one of logic input terminals 34, 35 and 36. The drains of the input transistors are connected in common to the collector of NPN transistor 37, connected as a diode. The emitter of transistor 37 is connected to circuit ground through resistor 38. In addition, the drains of the input transistors are connected to the base of a second NPN transistor 39 which has its emitter connected to ground and its collector connected in common with the sources of the input transistors to the base of NPN transistor 40. Transistor 40 and NPN transistor 41 have their emitters connected in common to the collector of NPN transistor 42. The base of transistor 42 is connected to a source of bias voltage $V_X$ and its emitter is connected to ground via a resistor 43. Transistor 42, like transistor 17 in FIG. 1, functions as a constant current source. The base of transistor 41, like transistor 19 in FIG. 1, is connected to a source of reference voltage, $V_R$. The reference voltage $V_R$ biases transistor 41 to be normally conducting when transistors 40 is not conducting. The collector of transistor 40 connected to a resistor 44, while the collector of transistor 41 is connected to a resistor 45. The two resistors 44 and 45 are, in turn, connected via a resistor 46 to the source of positive power supply voltage, $V_{CC}$. In addition, the sources of input PFETs 31, 32 and 33 are connected in common to the drain of PFET 47 which has its gate connected to circuit ground and its source connected to the voltage source $V_{CC}$. Thus, PFET 47, with its grounded gate, functions as a load to PFETs 31, 32 and 33. Outputs for the circuit are derived from two NPN transistors 48 and 49 connected as emitter followers. Transistor 48 has its base connected to the collector of transistors 40, while transistor 49 has its base connected to the collector of transistor 41. The collectors of transistors 48 and 49 are both connected to the positive power supply voltage $V_{CC}$. The emitter of transistor 48 is connected by resistor 50 to ground and to output terminal 51. The emitter of transistor 49 is connected by resistor 52 to ground and to an output terminal 53.

Figure 4:
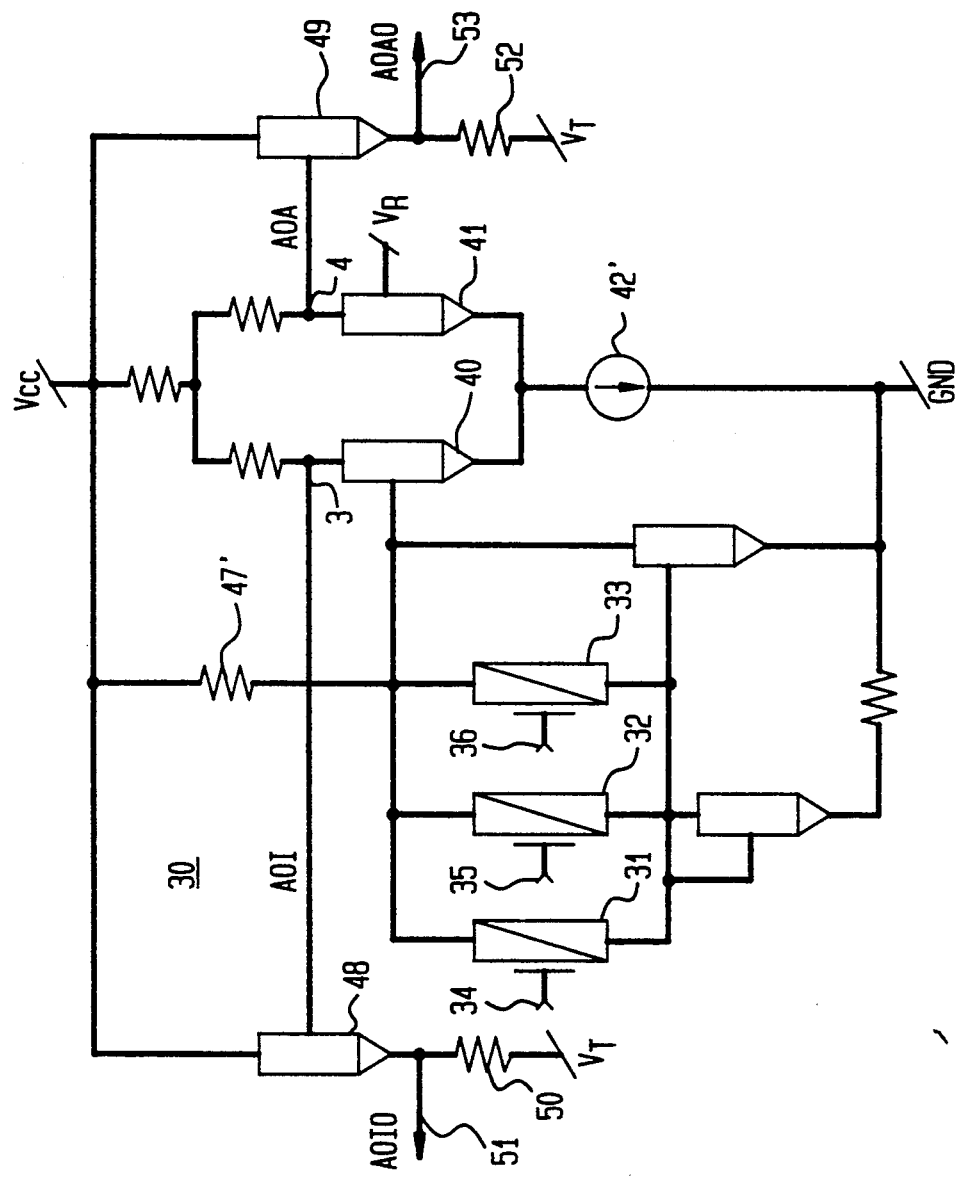
FIG. 4 is simplified schematic diagram which illustrates the operation of the circuit shown in FIG. 3.

The operation of the circuit will now be described with reference to FIG. 4 which shows the transistor 42 represented as constant current source 42' and transistor 47 represented as a load 47'. The PFETs 31, 32 and 33 along with transistors 37 and 39 resistor 38 and load 47' comprise a switchable current source at the base of transistor 40. A negative input voltage to any one of the input terminals 34, 35 or 36 will cause the corresponding input PFET 31, 32 or 33 to conduct, thereby lowering the voltage at the base of transistor 40, cutting that transistor off and raising the base voltage to output transistor 48. This, in turn, raises the voltage to the base of transistor 48, causing that transistor to conduct. The output terminal 51 will therefore assume a voltage corresponding to a logical "1". Assigning the inputs at terminals 34, 35 and 36 with the logical designations of A, B and C, respectively, then the output at terminal 51 is $\overline{A}+\overline{B}+\overline{C}$ or $\overline{A\cdot B\cdot C}$. On the other hand, the non-conduction of all of the input transistors 31, 32 or 33, corresponding to a logic "1" at the gates of those transistors, raises the base voltage of transistor 40 causing it to turn on, raising the emitter voltage of transistor 41 turning that transistor off, thus raising the voltage to the base of output transistor 49 causing it to conduct. The conduction of transistor 49 raises the voltage of output terminal 53 corresponding to a logical "1". Then the output at terminal 53 is A·B·C. Thus, the logical circuit performs the function of an NAND gate at output terminal 51 and an AND gate at output terminal 53. By dotting the collectors of transistors 40 and 41 similarly to the practice in CSEF circuits as described above, the output logical functions obtained at terminal 51 are labeled as AOIO (AND, OR, invert, OR), and at terminal 53, AOAO (AND, OR, AND, OR).

One of the advantages of the circuit shown in FIG. 3 is that it requires one +2.8 volt power supply ($V_{CC}$) with an internally generated reference voltage of +2.2 volts ($V_R$). Rather than connecting the resistors 50 and 52 to circuit ground, a separate $V_T$ power supply could be used to reduce power consumption of the circuit. An additional advantage is the increased logical function provided by this circuit when the collectors of the differential pair transistors are dotted. This provides an increased level of flexibility in logic design when using this circuit.

Figure 5:
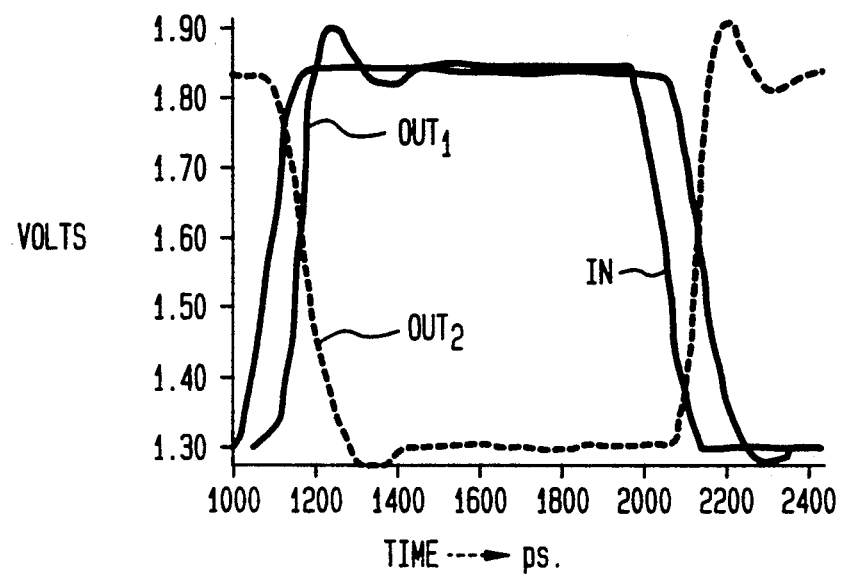
FIG. 5 is a graph showing the switching waveforms of the true and complement outputs of the circuit shown in FIG. 3.
Figure 6:
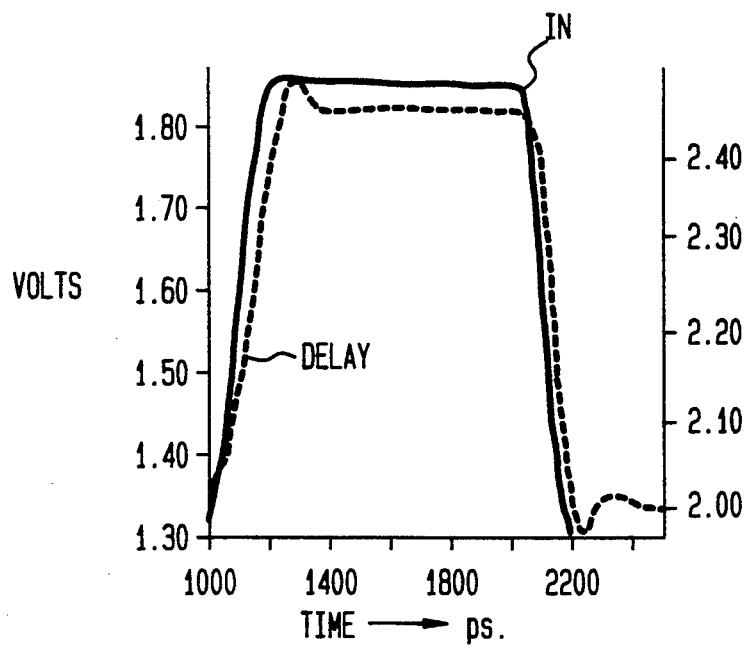
FIG. 6 is a graph showing the a.c. switching characteristics of the reflective current source as a function of the delay of the PFETs in the circuit shown in FIG. 3.
Figure 7:
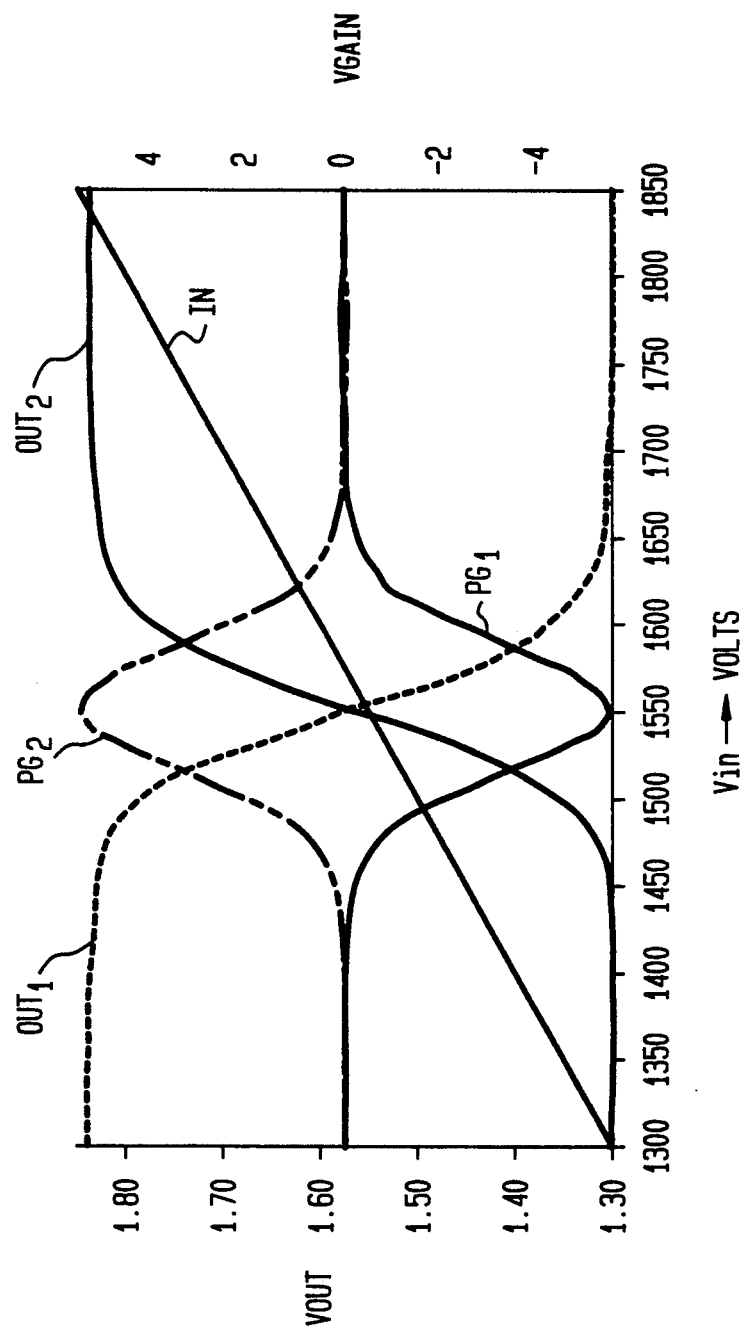
FIG. 7 is a graph showing the d.c. transfer function of the input versus the true and complement outputs and the accompanying small signal gain for the circuit shown in FIG. 3.

FIG. 5 is a graph showing the true and complement outputs, $OUT_1$ and $OUT_2$, respectively, of the circuit shown in FIG. 3 switching as a function of the input IN. FIG. 6 is a graph showing the a.c. switching characteristics of the reflective current source and the delay due to the PFETs 31, 32 and 33. While this delay is small, it is clear that as improvements are made in the switching characteristics of PFETs, the overall performance of the circuit shown in FIG. 3 will improve as well. FIG. 7 is a graph showing the d.c. transfer function of the input, IN, versus the true and complement outputs, OUT$_1$ and OUT$_2$, respectively, and the accompanying small signal gains, PG$_1$ and PG$_2$, of the outputs.

While the invention has been described in terms of a single preferred embodiment, those skilled in the art will recognize that the invention can be practiced with modification within the spirit and scope of the appended claims. For example, instead of PFETs and NPN transistors as used in the circuit of FIG. 3, NFETs and PNP transistors could be used, as is well understood in the art.

Having thus described our invention, what we claim as new and desire to secure by Letters Patent is as follows:

1. A BiFET logic circuit, comprising:
    a plurality of input lines and first and second output lines;
    a plurality of FET devices connected in parallel each having a gate connected to a corresponding one of said input lines;
    first and second bipolar transistors connected as a differential pair, the parallel connection of said FET devices providing an input to a base of said first bipolar transistor while a base of said second bipolar transistor is supplied with a reference voltage; and
    third and fourth bipolar transistors connected as emitter followers and driving said first and second output lines respectively, said third bipolar transistor having a base driven by said first bipolar transistor and said fourth bipolar transistor having a base driven by said second bipolar transistor.

2. The BiFET logic circuit recited in claim 1 further comprising:
    fifth bipolar transistor and a resistor connected in series with said parallel connection of said plurality of FET devices;
    a load connected in series with said parallel connection of said plurality of FET devices; and
    sixth bipolar transistor connected in parallel with the series connection of said fifth bipolar transistor, said resistor and said parallel connection of said plurality of FET devices and driven by a common junction between said fifth bipolar transistor and said parallel connection of said plurality of FET devices, the combination of said fifth and sixth bipolar transistors, said plurality of FET devices, said resistor and said load functioning as a switchable current source at said base of said first bipolar transistor.

3. The BiFET logic circuit recited in claim 2 wherein said load is an FET device.

4. The BiFET logic circuit recited in claim 2 further comprising:
    seventh bipolar transistor and a second resistor connected in series with said differential pair; and
    a source of bias voltage connected to a base of said seventh bipolar transistor, said seventh transistor, said second resistor and said source of bias voltage functioning as a constant current source for said differential pair.

5. The BiFET circuit recited in claim 1 wherein said FET devices are PFETs and said bipolar transistors are NPN transistors.

6. The BiFET circuit recited in claim 1 wherein said FET devices are NFETs and said bipolar transistors are PNP transistors.

* * * * *